(12) United States Patent
Murayama et al.

(10) Patent No.: US 7,728,357 B2
(45) Date of Patent: Jun. 1, 2010

(54) HETEROJUNCTION BIPOLAR TRANSISTOR AND MANUFACTURING METHOD THEREOF

(75) Inventors: Keiichi Murayama, Toyama (JP); Akiyoshi Tamura, Osaka (JP); Hirotaka Miyamoto, Toyama (JP); Kenichi Miyajima, Toyama (JP)

(73) Assignee: Panasonic Corporation, Osaka (JP)

( * ) Notice: Subject to any disclaimer, the term of this patent is extended or adjusted under 35 U.S.C. 154(b) by 493 days.

(21) Appl. No.: 11/614,113

(22) Filed: Dec. 21, 2006

(65) Prior Publication Data
US 2007/0145412 A1 Jun. 28, 2007

(30) Foreign Application Priority Data
Dec. 22, 2005 (JP) ............................. 2005-370916

(51) Int. Cl.
*H01L 29/739* (2006.01)
(52) U.S. Cl. ................ 257/197; 257/198; 257/E29.188
(58) Field of Classification Search ................ 257/197, 257/198, E29.188, E29.189
See application file for complete search history.

(56) References Cited

U.S. PATENT DOCUMENTS

| | | | |
|---|---|---|---|
| 5,270,223 A | 12/1993 | Liu | |
| 6,528,378 B2 | 3/2003 | Hirata et al. | |
| 6,531,721 B1 * | 3/2003 | Burton et al. | 257/197 |
| 7,091,528 B2 * | 8/2006 | Nogome et al. | 257/197 |
| 2002/0121675 A1 | 9/2002 | Azuma et al. | |
| 2003/0136956 A1 | 7/2003 | Niwa et al. | |

(Continued)

FOREIGN PATENT DOCUMENTS

CN 1433082 7/2003

(Continued)

OTHER PUBLICATIONS

Sze, S. M. "Physics of Semiconductor Devices", John Wiley & Sons, New York, London, Sidney, Toronto, 1969, pp. 282-289; Applicant's note that this document corresponds to Sze, A. "$2^{nd}$ Edition of Semiconductor Devices", pp. 147 ff., which is cited and discussed, beginning at p. 4, line 3 in the specification.

(Continued)

*Primary Examiner*—Minh-Loan T Tran
(74) *Attorney, Agent, or Firm*—Greenblum & Bernstein, P.L.C.

(57) ABSTRACT

The object of the present invention is to provide a heterojunction bipolar transistor with high breakdown tolerance which can be manufactured at a high reproducibility and a high yield, the heterojunction bipolar transistor includes: a sub-collector layer; a collector layer formed on the sub-collector layer; a base layer formed on the collector layer; and an emitter layer, which is formed on the base layer and is made of a semiconductor that has a larger bandgap than a semiconductor of the base layer, in which the collector layer includes: a first collector layer formed on the sub-collector layer; a second collector layer formed on the first collector layer; and a third collector layer formed between the second collector layer and the base layer, a semiconductor of the first collector layer differs from semiconductors of the third collector layer and the second collector layer, and an impurity concentration of the second collector layer is lower than an impurity concentration of the sub-collector layer and higher than an impurity concentration of the third collector layer.

10 Claims, 8 Drawing Sheets

U.S. PATENT DOCUMENTS

2004/0262634 A1* 12/2004 Murayama et al. .......... 257/197
2006/0284212 A1   12/2006 Murayama et al.

FOREIGN PATENT DOCUMENTS

| EP | 0 746 035   | 4/1996 |
|----|-------------|--------|
| EP | 1 168 452   | 1/2002 |
| EP | 1 329 959   | 7/2003 |
| JP | 2000-260783 | 9/2000 |
| WO | 03/058710   | 7/2003 |
| WO | 2005/101528 | 10/2005 |

OTHER PUBLICATIONS

English language Abstract of JP 2000-260783.
U.S. Appl. No. 11/554,221, filed Oct. 30, 2006, and entitled "Hetero-Junction Bipolar Transistor".
Chinese Office Action dated Nov. 27, 2009 that issued with respect to patent family member Chinese Patent Application No. 2006-10169050.8.

* cited by examiner

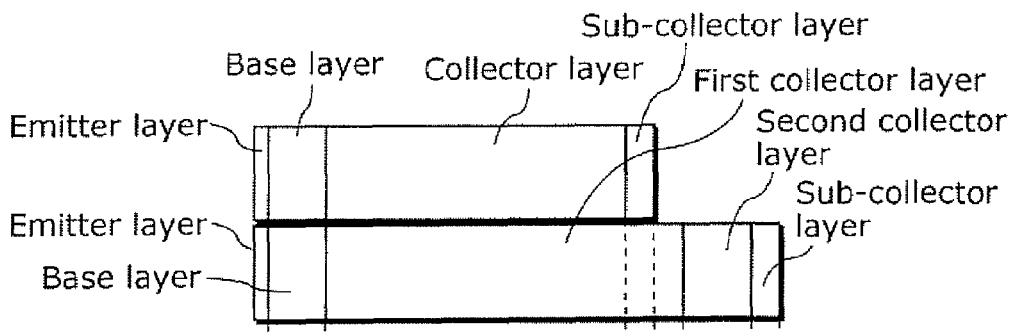
FIG. 5A
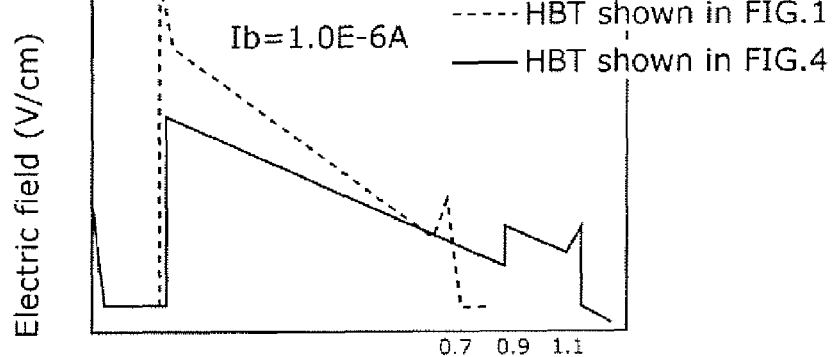
FIG. 5B
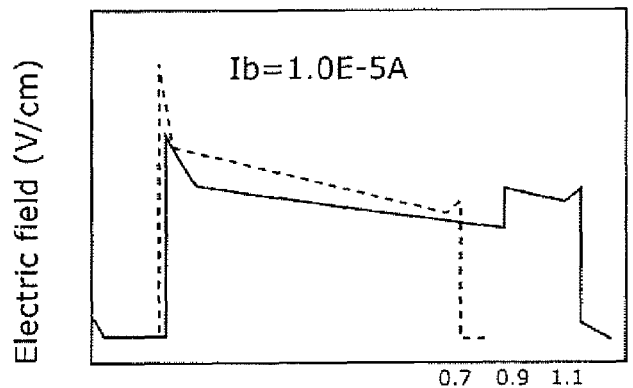
FIG. 5C
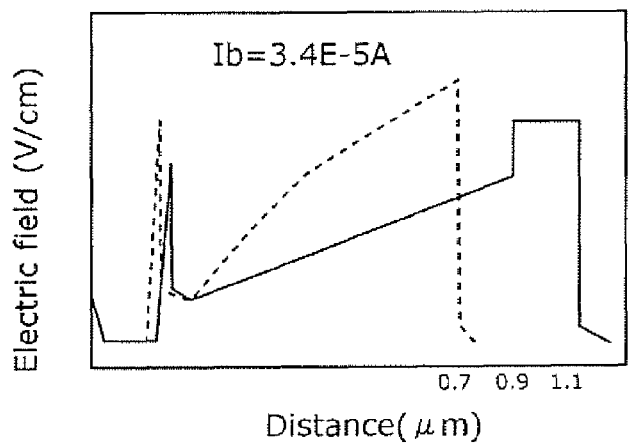
Distance($\mu$m)

HETEROJUNCTION BIPOLAR TRANSISTOR AND MANUFACTURING METHOD THEREOF

BACKGROUND OF THE INVENTION (1) Field of the Invention

The present invention relates to a heterojunction bipolar transistor, and particularly to an InGaP/GaAs heterojunction bipolar transistor.

(2) Description of the Related Art

Heterojunction bipolar transistors (HBT) using semiconductor with large bandgap for emitter have been in practical use as high-frequency analogue elements for mobile phones and the like. In particular, an InGaP/GaAs HBT using InGaP as an emitter has small temperature dependency of current gain (HFE) since discontinuity of valence band ($\Delta$Ev) is large, and is expected to be widely used as a highly reliable device.

A device structure of a general InGaP/GaAs HBT is described hereafter with reference to a diagram (for example, see Japanese Laid-Open Patent Application No. 2000-260783).

FIG. 1 is a diagram showing a structure of an npn-type InGaP/GaAs HBT.

As shown in FIG. 1, in the InGaP/GaAs HBT, an n$^+$-type GaAs sub-collector layer 202 which is formed by doping an n-type impurity at a high concentration is stacked on a semi-insulating GaAs substrate 201. On the sub-collector layer 202, a GaAs collector layer 203 that is either non-doped or of n-type with low impurity concentration, p-type GaAs base layer 207 with a high-impurity concentration, and an n-type InGaP emitter layer 208 are sequentially stacked. These layers form a convex portion formed only on a range of the sub-collector layer 202. Furthermore, on the emitter layer 208, an n-type GaAs emitter cap layer 209 and a low-resistance n-type InGaAs emitter contact layer 210 are sequentially stacked. The emitter cap layer 209 and the emitter contact layer 210 form the second convex portion formed only on the emitter layer 208.

Here, on the emitter contact layer 210, an emitter electrode 251 made of, for example, Ti/Pt/Au and the like, is formed. On the emitter layer 208, a base electrode 252 made of multilayer metal and the like including Pt is formed by heat diffusion on the emitter layer 208 that is exposed in the periphery of the emitter cap layer 209 so as to contact the base layer 207. On the sub-collector layer 202, a collector electrode 253 made of AuGe/Ni/Au and the like is formed. Furthermore, in order to electrically separate the HBT from other HBT, an element isolation region 254 ranging from the sub-collector layer 202 to the substrate 201 is formed by ion implantation and inactivated heat treatment in an element peripheral region of the substrate 201 and the sub-collector layer 202.

SUMMARY OF THE INVENTION

In recent years, the usage of InGaP/GaAs transistors has been expanded. For example, only as transmission amplifier for cellular phones, practical use as a power device in a terminal transmission unit, not only for the conventional CDMA system but also for the GSM system has been considered. When used in the GSM system, it is required for an HBT to be more tolerant of over input and load change. For example, in the WCDMA system, the required breakdown tolerance level is to achieve Vs=4.2V in VSWR=8:1, while in the GSM system, the required breakdown tolerance level is to achieve Vs=4.5V in VSWR=20:1. In other words, higher breakdown tolerance is required for the GSM system. Thus, in order to apply an InGaP/GaAs HBT as a transmission amplifier in the GSM system, it is essential to achieve the breakdown tolerance level. However, with the conventional InGaP/GaAs HBT technology, the required breakdown tolerance level cannot be achieved.

An HBT breakdown is described hereafter.

FIG. 2 is a diagram showing a collector voltage Vc-collector current Ic and a breakdown curve drawn by plotting the points where transistor breakdown occurs in each base current Ib.

As shown in FIG. 2, the HBT breakdowns can be divided into the breakdowns in the low-current area A and the breakdowns in the high-current area B. The device breakdown during power operation in the GSM system occurs when either the low-current area A or the high-current area B overlaps with the load curve.

FIGS. 3A, 3B, and 3C are diagrams showing the results of an electric intensity simulation of the conventional HBT shown in FIG. 1, performed by the inventor of the present invention. In FIGS. 3A, 3B, and 3C, the horizontal axis indicates the distance from the emitter layer surface to the sub-collector layer, and the vertical axis indicates the electric intensity in each current value. FIG. 3A is in the low-current area A (for example, $I_B$=1 µA), FIG. 3B is between the low-current area A and the high-current area B (for example, $I_B$=10 µA), and FIG. 3C is in the high-current area B (for example, $I_B$=34 µA).

In FIGS. 3A, 3B, and 3C, in the low-current area A, maximum electric intensity is applied on the boundary surface of the base layer and the collector layer, and avalanche breakdown which causes device breakdown occurs on the boundary surface of the base layer and the collector layer (FIG. 3A). However, when current increases and electrons with a density more than the collector density is implanted to the collector (Kirk effect), an area where the maximum electric intensity is applied, shifts from the base side to the sub-collector side (FIG. 3B). Furthermore, when the current further increases, the maximum electric intensity is applied on the boundary surface of the collector layer and the sub-collector layer (FIG. 3C), occurrence of avalanche breakdown that causes device breakdown is qualitatively observed. Note that this phenomenon is described in detail in page 147 of a reference book "2nd edition of Semiconductor Devices" by A. Sze.

As described above, in order to improve breakdown tolerance of an HBT, it is required to relax both the electric intensity concentrations between the base layer and the collector layer in the low-current area A and between the collector layer and the sub-collector layer in the high-current area B. There has been several proposals for lowering the electric intensity concentration between the base layer and the collector layer in the low-current area A, and an example is described hereafter.

FIG. 4 is a cross-section diagram showing a structure of a high breakdown tolerance HBT.

As shown in FIG. 4, in this HBT, a sub-collector layer 302, a collector layer 303, a base layer 306, an emitter layer 307, an emitter cap layer 308 and an emitter contact layer 309 are sequentially stacked on a semi-insulating GaAs substrate 301.

Here, the collector layer 303 is made of two layers, a first collector layer 304 and a second collector layer 305. The first collector layer 304 contacts the sub-collector layer 302 and has a medium impurity concentration approximately at $5 \times 10^{16}$ cm$^{-3}$. The second collector layer 305 contacts the base layer 306, and is non-doped or doped at a low impurity concentration.

On the emitter contact layer 309, an emitter electrode 351 is formed. On the emitter layer 307, a base electrode 352 is formed. On the sub-collector layer 302, a collector electrode 353 is formed. Furthermore, in an element periphery region on the substrate 301 and the sub-collector layer 302, an element isolation region 354 is formed.

FIGS. 5A, 5B, and 5C are diagrams showing the results of an electric intensity simulation of the HBT shown in FIG. 4 and the conventional HBT shown in FIG. 1 performed by the inventor. The HBT shown in FIG. 4 includes the second collector 305 made of a GaAs layer of 800 nm in film thickness with a low impurity concentration, the first collector layer 304 made of n-type GaAs of 200 nm in thickness with a medium impurity concentration, and the total film thickness of the collector layer 303 is 1000 nm.

In FIGS. 5A, 5B, and 5C, the horizontal axis indicates distance from the emitter layer surface to the sub-collector surface, and the vertical axis indicates electric intensity intensity in each current value. FIG. 5A is in the low-current area A (for example, $I_B$=1 μA), FIG. 5B is between the low-current area A and the high-current area B (for example, $I_B$=10 μA), and FIG. 5C is in the high-current area B (for example, $I_B$=34 μA).

From FIGS. 5A, 5B, and 5C, an HBT with the structure mentioned above, electric intensity is controlled in a low level compared with the conventional HBT shown in FIG. 1 both in the low-current area A and the high-current area B, and avalanche breakdown is unlikely to occur. In other words, breakdown tolerance of the HBT is improved. Note that this method is described in detail in an invention by Skyworks (U.S. Pat. No. 6,531,721 B1).

However, when manufacturing the HBT with a structure described above, in the case where the film of the collector layer 303 is extremely thick and is 1000 nm or more in thickness, etching for exposing the surface of the collector layer 303 cannot be controlled well, and the processing difficulty significantly increases.

Here, it is possible to improve reproducibility by using an etching stopper layer made of a material with high etching tolerance against the first collector layer 304, the second collector layer 305 or the sub-collector layer 302 for the collector layer 303 or the sub-collector layer 302. However, material used for etching stopper layer is generally AlGaAs or InGaP and the like, which have large bandgaps against GaAs, often causing in conduction band discontinuity in the collector layer. As a result, collector resistance increase caused by the conduction band discontinuity or degradation of high-frequency characteristics of the transistor caused by the accumulation and staying effect of the carrier occur. In addition, in the case where the etching stopper layer is made of ordered InGaP, carrier location occurs in InGaP, and local electric intensity concentration occurs, and thus breakdown tolerance degrades. Furthermore, in the case where a material different from the materials described above as the etching stopper layer is used, it might cause increase in defect level of the base layer and the boundary surface of the base layer and the emitter layer due to lowered crystallinity, which could lower β and credibility.

In view of the problem mentioned above, an object of the present invention is to provide a high breakdown tolerance HBT which can be manufactured with a good reproducibility and a high yield.

In order to achieve the object above, a heterojunction bipolar transistor according to the present invention is a heterojunction bipolar transistor including: a sub-collector layer; a collector layer formed on said sub-collector layer; a base layer formed on said collector layer; and an emitter layer, which is formed on the base layer and is made of a semiconductor that has a larger bandgap than a semiconductor of the base layer, in which the collector layer includes: a first collector layer formed on the sub-collector layer; a second collector layer formed on the first collector layer; and a third collector layer formed between the second collector layer and the base layer, a semiconductor of the first collector layer differs from semiconductors of the third collector layer and the second collector layer, and an impurity concentration of the second collector layer is lower than an impurity concentration of the sub-collector layer and higher than an impurity concentration of the third collector layer. Here, the first collector layer may be made of AlGaAs having an impurity concentration higher than the impurity concentration of the sub-collector layer. In addition, the third collector layer may be made up of two or more layers of different impurity concentrations, an impurity concentration of the third collector layer may gradually increase from a boundary surface of the third collector layer and the base layer toward a boundary surface of the third collector layer and the second collector layer.

With this structure, the collector layer includes a semiconductor layer with a low impurity concentration and a semiconductor layer with a medium impurity concentration. Thus, as shown in FIGS. 5A, 5B, and 5C, electric intensity concentration can be relaxed, and breakdown tolerance of an HBT can be improved. In addition, the first collector layer is formed with a semiconductor different from the third collector layer and the second collector layer, and functions as an etching stopper layer when an etching for the collector layer is performed. Therefore, etching stability can be improved and it is possible to manufacture HBTs at a high reproducibility and a high yield. In other words, it is possible to realize a high breakdown tolerance heterojunction bipolar transistor which can be manufactured at a high reproducibility and a high yield.

In addition, the first collector layer may be made of InGaP having an impurity concentration higher than the impurity concentration of said sub-collector layer.

With this structure, a resistance of the first collector layer can be lowered by increasing the impurity concentration of the first collector layer to, for example, $10^{18th}$ order. Thus, high breakdown voltage and high yield can be realized without increasing collector resistance.

In addition, the first collector layer may be made of InGaP having a disordered structure.

With this structure, since doping efficiency of InGaP can be improved and the impurity concentration of the first collector layer can be increased, the resistance of the first collector layer can be lowered further. In addition, since carrier location in InGaP can be prevented, electric intensity concentration can be suppressed and thus breakdown tolerance of the heterojunction bipolar transistor can be improved.

In addition, the first collector layer may be made of InGaAs.

With this structure, the first collector layer is made of InGaAs with a small bandgap against GaAs, and thus a conduction band discontinuity (δEc) does not occur in the collector layer. Thus, it is possible to suppress degradation of transistor high-frequency characteristics caused by carrier accumulation effect and staying effect. In other words, a high performance heterojunction bipolar transistor can be realized. In addition, since the collector electrode is formed on an InGaAs layer with a small bandgap, contact resistance can be lower than a conventional case.

In addition, the first collector layer may be made up of a non-doped or doped InGaP layer placed in contact with the sub-collector layer, and a semiconductor layer, placed in contact with the second collector layer, with an impurity concentration higher than the impurity concentration of the InGaP layer.

With this structure, δEc can be reduced, and thus a heterojunction bipolar transistor with higher performance can be realized.

In addition, the InGaP layer may have a disordered structure.

With this structure, doping efficiency of InGaP increases, and the impurity concentration of the first collector layer can be increased. Thus, the resistance of the first collector layer can be lowered further. In addition, since carrier location in InGaP can be prevented, electric intensity concentration can be suppressed and thus breakdown tolerance of the heterojunction bipolar transistor can be improved.

In addition, the thickness of the first collector layer may range from 5 nm to 50 nm inclusive.

With this structure, resistance increase caused by the first collector layer hardly occurs, and thus it is possible to improve breakdown tolerance while suppressing characteristic degradation and increase yield.

In addition, the impurity concentration of the second collector layer ranges from $3 \times 10^{16}$ cm$^{-3}$ to $2 \times 10^{17}$ cm$^{-3}$ and the impurity concentration of the third collector layer may be lower than $3 \times 10^{16}$ cm$^{-3}$.

With this structure, electric intensity concentration can be effectively relaxed in a wide current region.

In addition, the second collector layer may be 400 nm or more in film thickness and the third collector layer may be 600 nm or less in film thickness.

With this structure, electric intensity concentration can be effectively relaxed.

In addition, the present invention may be a method for manufacturing a heterojunction bipolar transistor, the method including: stacking a sub-collector layer, a first collector layer, a second collector layer, a third collector layer, a base layer, and an emitter layer successively; and etching a part of the emitter layer, base layer, third collector layer, and second collector layer so that the first collector layer is exposed, in which, in said stacking, the following layers are stacked: the first collector layer made of a semiconductor different from semiconductors of the third collector layer and the second collector layer; the second collector layer with an impurity concentration lower than the impurity concentration of the sub-collector layer, the impurity concentration being higher than the impurity concentration of the third collector layer; and the emitter layer made of a semiconductor with a bandgap larger than a bandgap of a semiconductor forming the base layer.

According to this manufacturing method, by forming the first collector layer with a semiconductor having an etching selectiveness against the third collector layer and the second collector layer, the first collector layer can function as an etching stopper layer when etching for the collector layer is performed. Thus, etching process can be facilitated, and it is possible to manufacture a heterojunction bipolar transistor at a high reproducibility and a high yield.

According to the present invention, a high breakdown tolerance heterojunction bipolar transistor can be manufactured with higher processability. In other words, it is possible to realize a high breakdown tolerance heterojunction bipolar transistor which can be manufactured at a high reproducibility and a high yield compared with a conventional InGaP/GaAs heterojunction bipolar transistor.

Therefore, the present invention presents new possibility of an InGaP/GaAs HBT as a power amplifier in the terminal transmission unit of the GSM system, and the present invention is highly suitable for practical use.

Further Information about Technical Background to this Application

The disclosure of Japanese Patent Application No. 2005-370916 filed on Dec. 22, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5A to 5C are diagrams showing the results of the electric intensity simulation in the HBT;

DESCRIPTION OF THE PREFERRED EMBODIMENT(S)

Heterojunction bipolar transistors according to the embodiments of the present invention shall be described with reference to the diagrams.

First Embodiment

Figure 1:
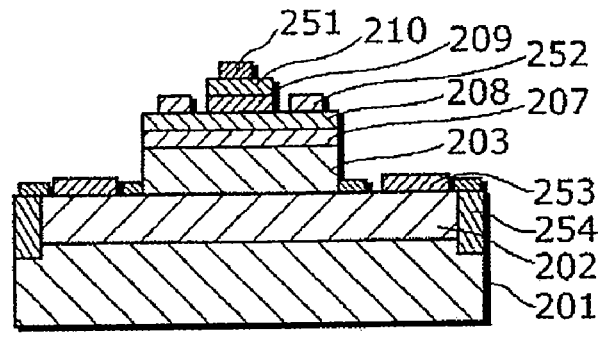
FIG. 1 is a cross-section diagram showing a structure of a conventional HBT.
Figure 2:
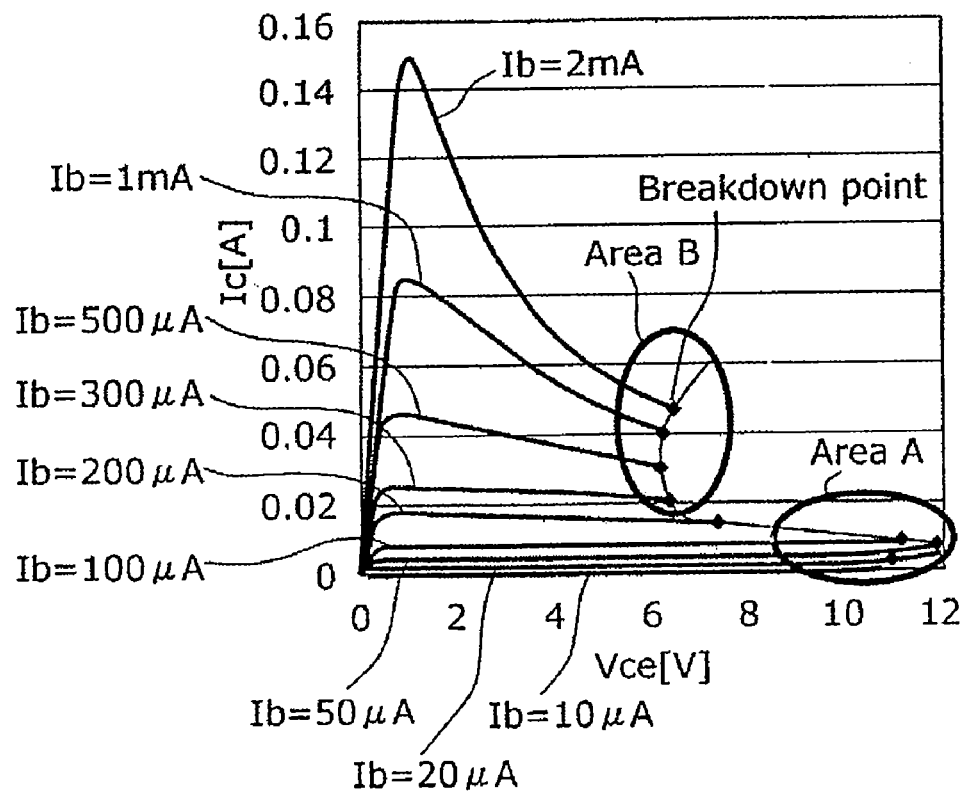
FIG. 2 is a diagram showing Vc-Ic curve and breakdown curve of an HBT.
Figures 3A, 3B, 3C:
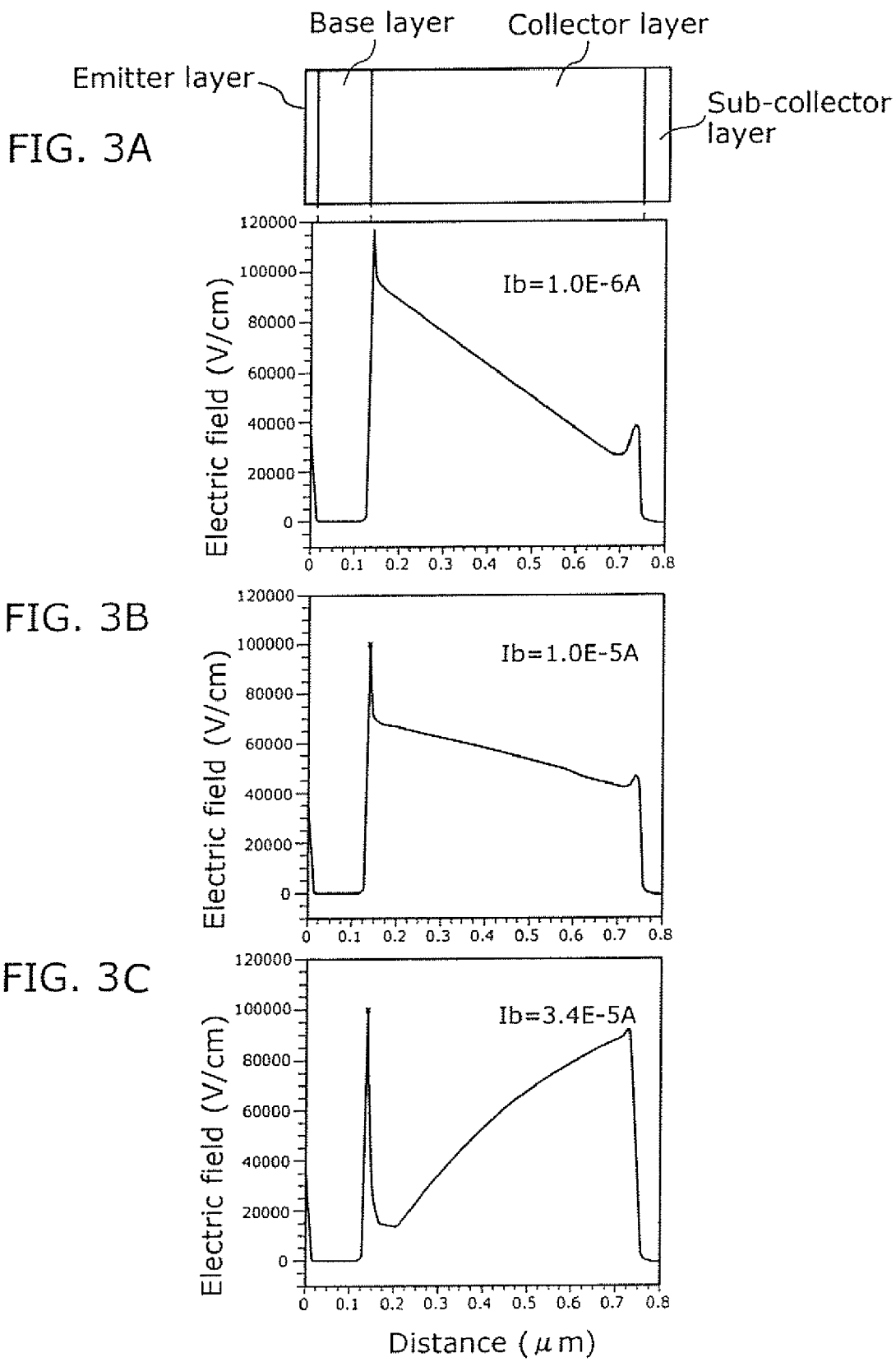
FIG. 3A to 3C are diagrams showing the results of electric intensity simulation of an HBT.
Figure 4:
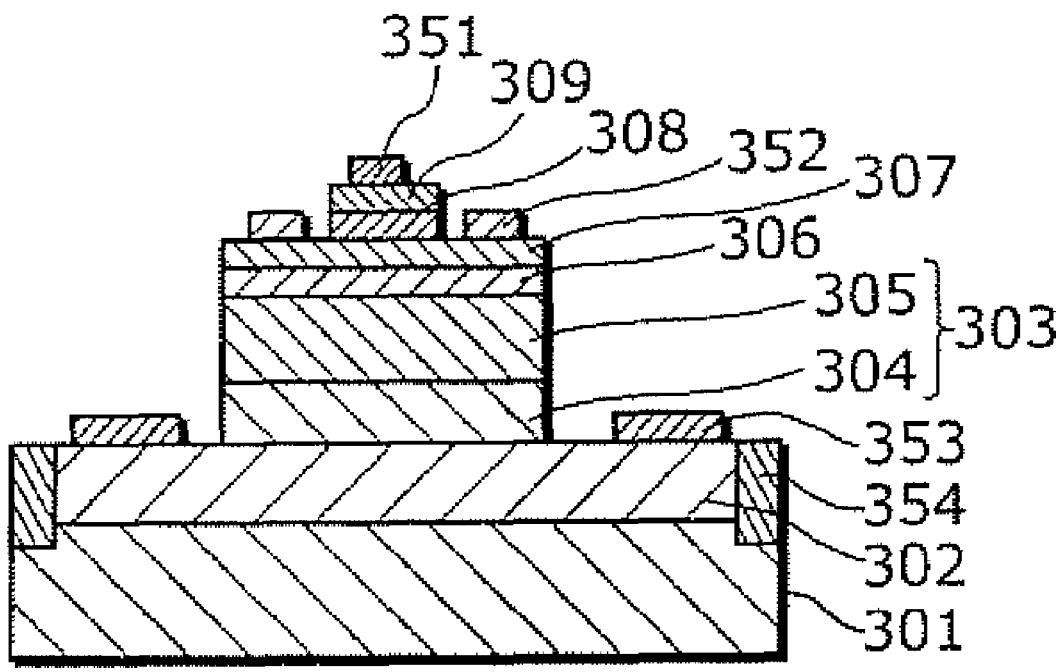
FIG. 4 is a cross-section diagram showing a structure of a high breakdown tolerance HBT.
Figure 6:
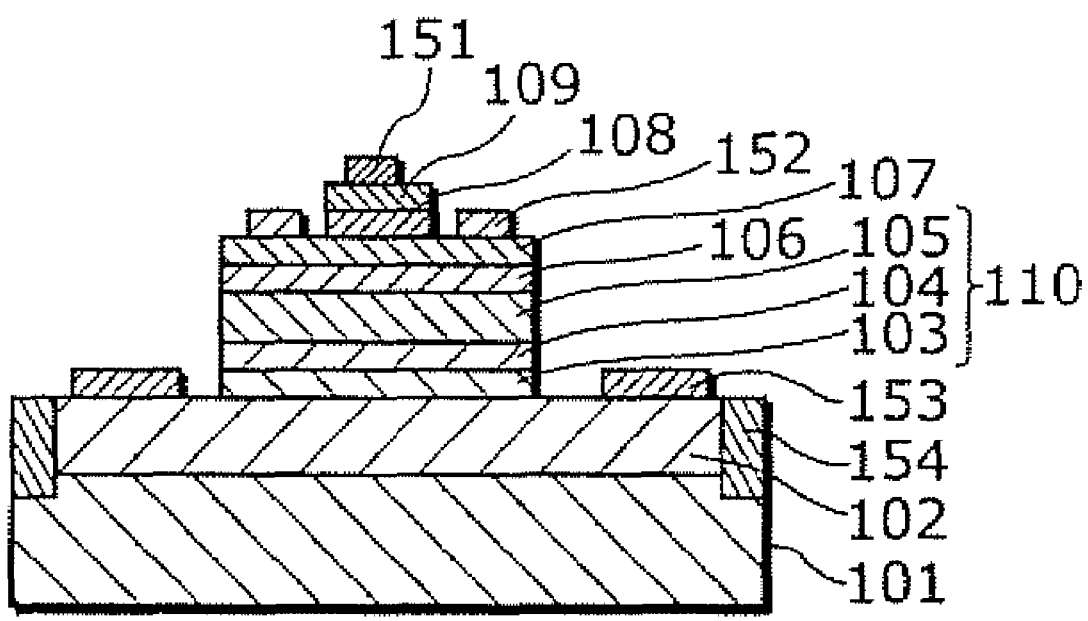
FIG. 6 is a cross-section diagram showing a structure of an HBT according to the first embodiment of the present invention.

FIG. 6 is a cross-section diagram showing a structure of an HBT according to the first embodiment of the present invention.

As shown in FIG. 6, in this HBT, on a substrate 101 made of semi-insulating GaAs, a sub-collector layer 102, a collector layer 110, a base layer 106, an emitter layer 107, an emitter cap layer 108, and an emitter contact layer 109 are sequentially formed. The sub-collector layer 102 is made of n$^+$-type GaAs doped with n-type impurity at a high concentration of $5 \times 10^{18}$ cm$^{-3}$. The collector layer 110 is doped with n-type impurity, and is formed on the sub-collector layer 102. The base layer 106 is formed on the collector layer 110, and is made of p-type GaAs of 100 nm in film thickness, doped with impurity at a high concentration of $4 \times 10^{19}$ cm$^{-3}$. The emitter layer 107 with a larger bandgap than the base layer 106 is formed on the base layer 106, and is made of InGaP doped with n-type impurity at an impurity concentration of $3 \times 10^{17}$ cm$^{-3}$. The collector layer 110, the base layer 106, and the emitter layer 107 are processed for forming a convex so as to separate the base region, and form a base island region. The emitter cap layer 108 and the emitter contact layer 109 are formed on the emitter layer 107 in a convex form for forming an emitter island region. The emitter cap layer 108 is made of GaAs of 200 nm in film thickness doped with n-type impurity at an impurity concentration of $3 \times 10^8$ cm$^{-3}$. The emitter contact layer 109 is made of InGaAs of 100 nm in film thickness, doped with n-type impurity at an impurity concentration of $1 \times 10^{19}$ cm$^{-3}$.

On a collector window formed in a region where the sub-collector layer 102 is exposed, a collector electrode 153 made of AuGe/Ni/Au and the like is formed by evaporation. In addition, on the emitter contact layer 109, an emitter electrode 151 made of Pt/Ti/Pt/Au and the like is formed. In a region where the emitter layer 107 is exposed around the emitter cap layer 108, a base electrode 152 made of Pt/Ti/Pt/Au and the like is formed by diffusing impurity with heat from the emitter layer 107 so as to make ohmic contact with the base layer 106.

The collector layer 110 is made up of a first collector layer 103 formed on the sub-collector layer 102, a second collector layer 104 formed on the first collector layer 103, and a third collector layer 105 formed between the second collector layer 104 and the base layer 106.

Here, the first collector layer 103 is made of a semiconductor which differs from semiconductors making up of the third collector layer 105 and the second collector layer 104. For example, the first collector layer 103 is made of n-type disordered InGaP of 30 nm in film thickness, doped with impurity at an impurity concentration of $5 \times 10^{18}$ cm$^{-3}$, an impurity concentration higher than the impurity concentration of the sub-collector layer 102. Since the film thickness of the first collector layer 103 is 5 nm or more and 50 nm or less, increase of resistance caused by the first collector layer 103 hardly occurs, and thus the characteristic degradation can be controlled. In addition, since the impurity concentration of the first collector layer 103 is high at the $10^{18th}$ order, the resistance of the first collector layer 103 can be lowered and thus the characteristic degradation can be controlled lower.

The second collector layer 104 is made of a semiconductor having an impurity concentration lower than the impurity concentration of the sub-collector layer 102 and higher than the third collector layer 105. For example, the second collector layer 104 is made of n-type GaAs of 400 nm in film thickness, doped with impurity at an impurity concentration of $5 \times 10^{16}$ cm$^{-3}$.

The third collector layer 105 is made of a semiconductor with an impurity concentration lower than impurity concentration of the second collector layer 104. For example, the third collector layer 105 is made of n-type GaAs of 600 nm in film thickness, doped with impurity at an impurity concentration of $5 \times 10^{15}$ cm$^{-3}$, or non-doped i-type GaAs. Here, since the impurity concentration of the second collector layer 104 is in a range from $3 \times 10^{16}$ to $2 \times 10^{17}$ cm$^{-3}$ and the impurity concentration of the third collector layer 105 is in a range from none to $3 \times 10^{16}$ cm$^{-3}$, electric intensity concentration can be effectively relaxed in a wide current region. In addition, since the film thickness of the second collector layer 104 is 400 nm or more and the film thickness of the third collector layer is 600 nm or less, electric intensity concentration can be effectively relaxed.

Next, a manufacturing method of an HBT with the above-mentioned structure is described with reference to FIGS. 7A to 7E. FIGS. 7A to 7E are diagrams showing a manufacturing method of the HBT.

Figure 7A:
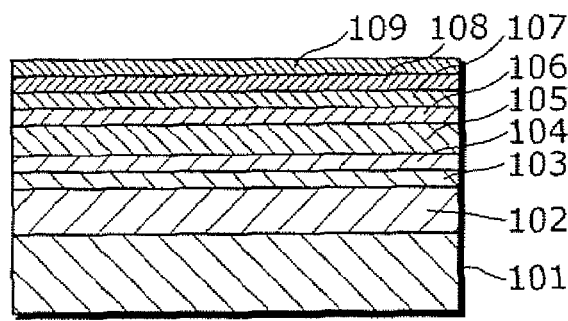
FIG. 7A to 7E are cross-section diagrams showing a manufacturing method of the HBT according to the first embodiment of the present invention.

First of all, as shown in FIG. 7A, on the semi-insulating the sub-collector layer 102, the first collector layer 103, the second collector layer 104, the third collector layer 105, the base layer 106, the emitter layer 107, the emitter cap layer 108, and the emitter contact layer 109 are sequentially stacked using a crystal growth method such as the MBE (molecular beam epitaxy) method or the MOCVD (metal organic chemical vapor deposition) method or the like. The sub-collector layer 102 is made of n$^+$-type GaAs doped with n-type impurity at a high concentration of $5 \times 10^{18}$ cm$^{-3}$. The first collector layer 103 is made of InGaP of 30 nm in film thickness, doped with n-type impurity at an impurity concentration of $5 \times 10^{18}$ cm$^{-3}$. The second collector layer 104 is made of GaAs of 400 nm in film thickness, doped with n-type impurity at an impurity concentration of $5 \times 10^{16}$ cm$^{-3}$. The third collector layer 105 is made of GaAs of 600 nm in film thickness, doped with n-type impurity at an impurity concentration of $5 \times 10^{15}$ cm$^{-3}$. The base layer 106 is made of GaAs of 100 nm in film thickness, doped with p-type impurity at an impurity concentration of $4 \times 10^{19}$ cm$^{-3}$. The emitter layer 107 is made of InGaP of 50 nm in film thickness, doped with n-type impurity at an impurity concentration of $3 \times 10^{17}$ cm$^{-3}$. The emitter cap layer 108 is made of GaAs of 200 nm in film thickness, doped with n-type impurity at an impurity concentration of $3 \times 10^{18}$ cm$^{-3}$. The emitter contact layer 109 is made of InGaAs of 100 nm in film thickness, doped with n-type impurity at an impurity concentration of $1 \times 10^{19}$ cm$^{-3}$.

Figure 7B:
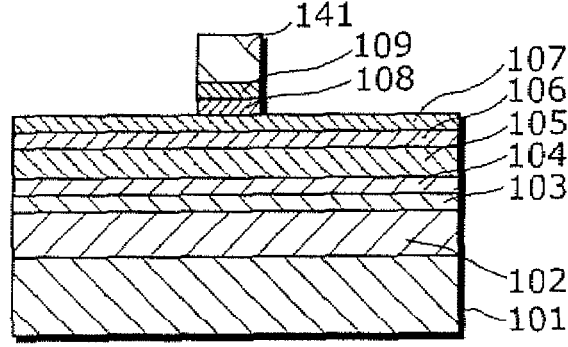

Next, as shown in FIG. 7B, the emitter island region is covered with a photo resist mask 141, and the emitter island region is formed by sequentially etching a part of the emitter contact layer 109 and a part of the emitter cap layer 108 with a mixed solution of phosphoric acid, hydrogen peroxide, and water. Here, the emitter layer 107 is hardly etched.

Figure 7C:
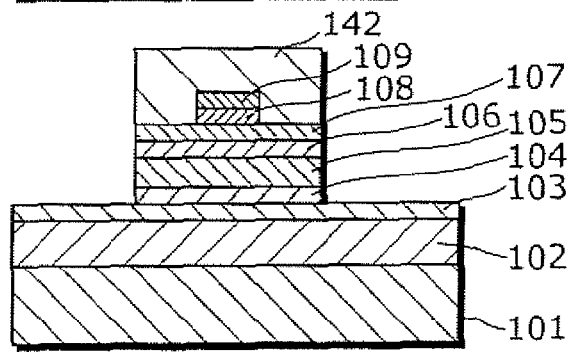

Next, as shown in FIG. 7C, the base island region is covered with another photo resist mask 142. The base island region is formed by etching a part of the emitter layer 107 selectively with hydrochloric acid diluted with water, and sequentially removing part of the base layer 106, the third collector layer 105, and the second collector layer 104 with mixed solution of phosphoric acid, hydrogen peroxide, and water using the emitter layer 107 as a mask. Here, the etching for forming the base island region is a selective etching in which etching is stopped against etching solution made of phosphoric acid and hydrogen peroxide, the first collector layer 103 made of InGaP functions as an etching stopper layer. Thus, compared to the conventional technology, accuracy in etching depth can be significantly improved when forming a base island region. Subsequently, using the second collector layer 104 as a mask, the first collector layer 103 is selectively etched using a solution made of hydrochloric acid diluted with water, a solution different from the etching solution used for the etching of the base layer 103, the third collector layer 105, and the second collector layer 104. Here, the sub-collector layer 102 made of GaAs functions as an etching stopper layer. Note that 5 nm or more is sufficient as the film thickness of the first collector layer 103 for an etching stopper layer. For example, if the first collector layer 103 is of approximately 30 nm in film thickness, the first collector layer can adequately function as an etching stopper.

Figure 7D:
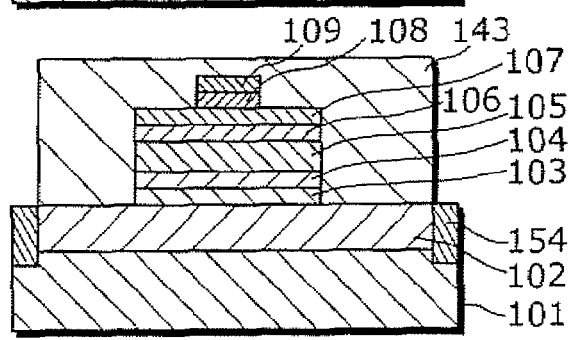

Next, as shown in FIG. 7D, the element isolation region 154 is formed in order to electrically isolate the HBT to be manufactured from other HBT. More specifically, after the photo resist mask 143 is formed, ion implantation is performed to the sub-collector layer 102 under an ion implantation condition at an accelerating voltage of 100 kev and a dose amount of $6 \times 10^{13}$ cm$^{-2}$.

Figure 7E:
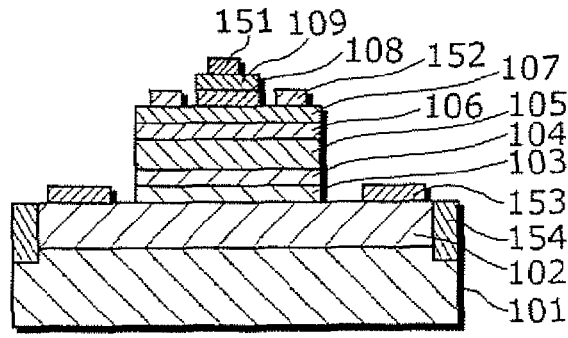

Since a manufacturing method to be described hereafter is a general HBT manufacturing method, detailed description shall be omitted. As shown in FIG. 7E, an HBT is formed through a process of sequentially forming the collector electrode 153, the emitter electrode 151, and the base electrode 152 and a process for forming an insulating film.

As described above, according to the HBT of the first embodiment, the collector layer 110 includes a low-impurity concentration semiconductor layer and a medium-impurity concentration semiconductor layer. Thus, as described in FIGS. 5A, 5B, and 5C, electric intensity concentration can be relaxed and the breakdown tolerance of the HBT can be improved. In addition, etching selection ratio of InGaP is 30 times more than the etching selection ratio of GaAs in dry etching using chlorinated etching gas, and 100 times more in wet etching using phosphoric acid. According to the HBT of the first embodiment, the third collector layer 105 and the second collector layer 104 is made of GaAs and the first collector layer 103 are made of InGaP with an etching selectivity against GaAs, and thus the first collector layer 103 functions as an etching stopper layer when etching the collector layer 110. As a result, reproducibility by etching can be improved, and thus a high-breakdown tolerance HBT which can be manufactured at a high reproducibility and a high yield can be realized.

In addition, according to the HBT of the first embodiment, the first collector layer 103 is made of disordered InGaP. Thus, doping efficiency of InGaP improves, and the impurity concentration for the first collector layer 103 can be increased, and it is possible to lower the resistance of the first collector layer 103 and to control increase in resistance caused by the first collector layer 103. In addition, since it is possible to prevent carrier location in InGaP, electric intensity concentration can be suppressed and breakdown tolerance of an HBT can be improved as well.

Second Embodiment

Figure 8:
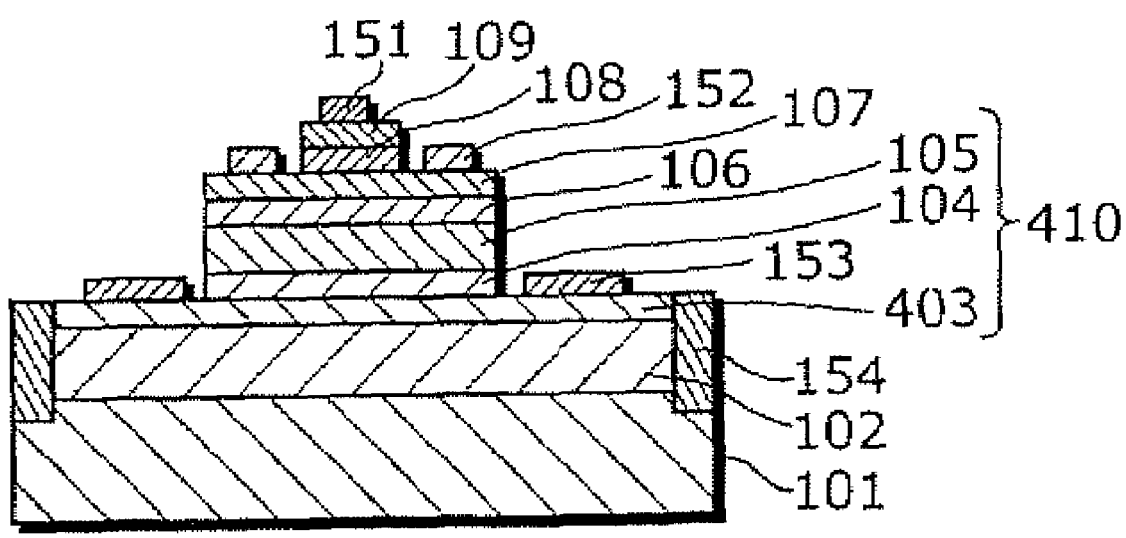
FIG. 8 is a cross-section diagram showing the structure of the HBT according to the second embodiment of the present invention.

FIG. 8 is a cross-section diagram showing a structure of an HBT according to the second embodiment of the present invention.

As shown in FIG. 8, in this HBT, on the substrate 101 made of semi-insulating GaAs, the sub-collector layer 102, a collector layer 410, the base layer 106, the emitter layer 107, the emitter cap layer 108, and the emitter contact layer 109 are sequentially stacked. Here, the collector layer 410, the base layer 106, and the emitter layer 107 are processed to form a convex form, forming a base island region. The emitter cap layer 108 and the emitter contact layer 109 are stacked for forming a convex form, forming an emitter island region.

On a collector window formed where the first collector layer 403 is exposed, the collector electrode 153 made of AuGe/Ni/Au and the like is formed by evaporation. On the emitter contact layer 109, the emitter electrode 151 made of Pt/Ti/Pt/Au and the like is formed, and where the emitter layer 107 is exposed around the emitter cap layer 108, the base electrode 152 is formed by diffusing impurity with heat from the emitter layer 107 so as to make ohmic contact with the base layer 106.

The collector layer 410 includes a first collector layer 403, a second collector layer 104 formed on the first collector layer 403, a third collector layer 105 formed between the second collector layer 104 and the base layer 106.

Here, the first collector layer 403 is made of a semiconductor different from the semiconductors forming the third collector layer 105 and the second collector layer 104. For example, the first collector layer 403 is made of InGaAs of 30 nm in film thickness doped with impurity at an impurity concentration of $5 \times 10^{18}$ cm$^{-3}$, an impurity concentration more than the impurity concentration of the sub-collector layer 102. Here, if the ratio of In in the first collector layer 403 is increased, lattice mismatch increases, and crystallinity of the base layer 106 and the emitter layer 107 to be subsequently formed decreases. Thus, it is important that the film thickness of the first collector layer does not exceed critical film thickness. The film thickness of the first collector layer 403 is 30 nm, and the In ratio is less than 3.0, for example, 0.24, and thus it is possible to form a layer over the first collector layer 403 without lowering crystallinity.

Next, the manufacturing method of the HBT with the structure above shall be described with reference to FIGS. 9A to 9E. FIGS. 9A to 9E are cross-section diagrams showing a manufacturing method of an HBT.

Figure 9A:
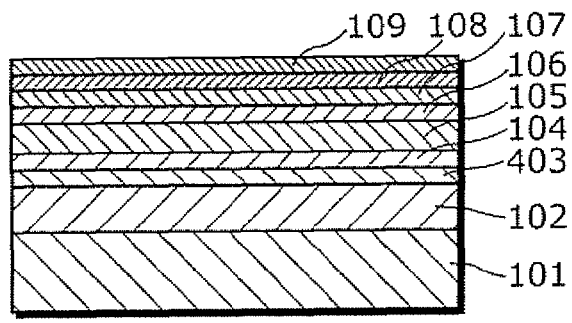
FIG. 9A to 9E are cross-section diagrams showing a manufacturing method of the HBT according to the second embodiment.

First, as shown in FIG. 9A, on the semi-insulating substrate 101, the sub-collector layer 102, the first collector layer 403, the second collector layer 104, the third collector layer 105, the base layer 106, the emitter layer 107, the emitter cap layer 108, and the emitter contact layer 109 are sequentially stacked with a crystal growth method such as the MBE (molecular beam epitaxy) method or the MOCVD (metal organic chemical vapor deposition) method or the like. The sub-collector layer 102 is made of n$^{+}$-type GaAs doped with n-type impurity at a high concentration of $5 \times 10^{18}$ cm$^{-3}$. The first collector layer 403 is made of InGaAs of 30 nm in film thickness, doped with n-type impurity at an impurity concentration of $5 \times 10^{18}$ cm$^{-3}$. The second collector layer 104 is made of GaAs of 400 nm in film thickness, doped with n-type impurity at an impurity concentration of $5 \times 10^{16}$ cm$^{-3}$. The third collector layer 105 is made of GaAs of 600 nm in film thickness, doped with n-type impurity at an impurity concentration of $5 \times 10^{15}$ cm$^{-3}$. The base layer 106 is made of GaAs of 100 nm in film thickness, doped with p-type impurity to at an impurity concentration of $4 \times 10^{19}$ cm$^{-3}$. The emitter layer 107 is made of InGaP of 50 nm in film thickness, doped with n-type impurity at an impurity concentration of $3 \times 10^{17}$ cm$^{-3}$. The emitter cap layer 108 is made of GaAs of 200 nm in film thickness, doped with n-type impurity at an impurity concentration of $3 \times 10^{18}$ cm$^{-3}$. The emitter contact layer 109 is made of InGaAs of 100 nm in film thickness, doped with n-type impurity at an impurity concentration of $1 \times 10^{19}$ cm$^{-3}$.

Figure 9B:
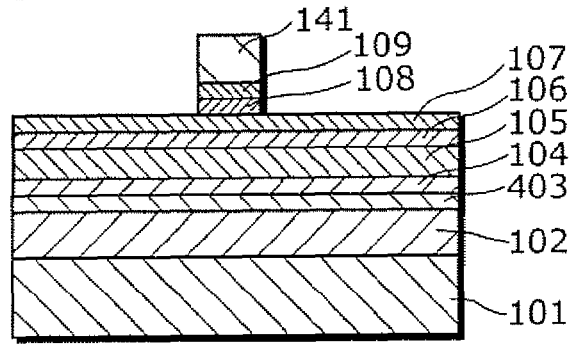

Next, as shown in FIG. 9B, the emitter island region is covered with a photo resist mask 141, and the emitter island region is formed by sequentially etching a part of the emitter contact layer 109 and a part of the emitter cap layer 108 with a mixed solution of phosphoric acid, hydrogen peroxide, and water. Here, the emitter layer 107 is hardly etched.

Figure 9C:
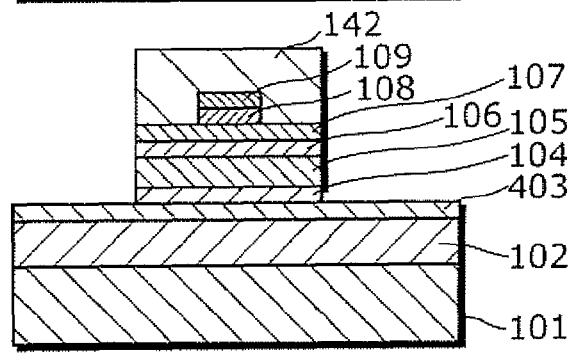

Next, as shown in FIG. 9C, the base island region is covered with another photo resist mask 142. The base island region is formed by etching a part of the emitter layer 107 selectively with hydrochloric acid diluted with water, and sequentially removing part of the base layer 106, the third collector layer 105, and the second collector layer 104 with mixed solution of citric acid, hydrogen peroxide, and water using the emitter layer 107 as a mask. Here, the etching for forming the base island region is a selective etching in which etching is stopped against etching solution made of citric acid and hydrogen peroxide, and the first collector layer 403 made of InGaAs functions as an etching stopper layer. Thus, compared to the conventional technology, accuracy in etching depth can be significantly improved when forming the base island region.

Figure 9D:
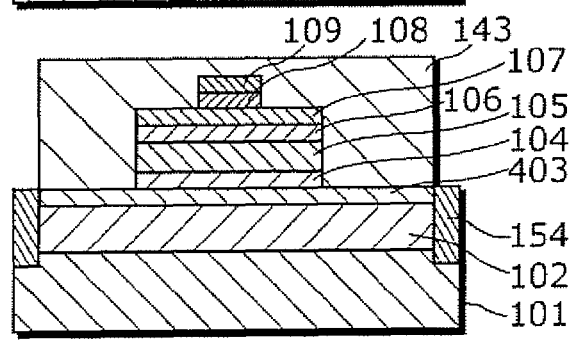

Next, as shown in FIG. 9D, the element isolation region 154 is formed in order to electrically isolate the HBT to be manufactured from other HBT. More specifically, after the photo resist mask 143 is formed, ion implantation is performed to the sub-collector layer 102 under an ion implantation condition at an accelerating voltage of 100 kev and a dose amount of $6 \times 10^{13}$ cm$^{-2}$.

Figure 9E:
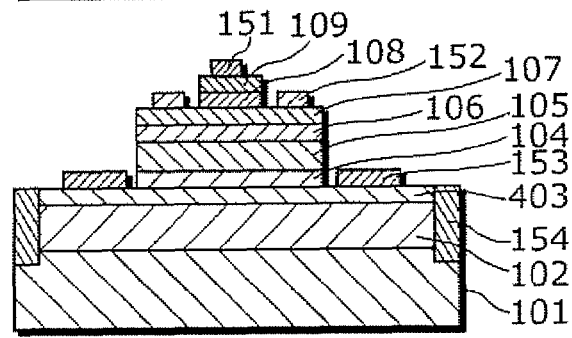

Next, as shown in FIG. 9E, after a photo resist mask with an opening for the region where the collector electrode 153 is to be formed, AuGe/Ni/Au for the collector electrode 153 is formed by evaporation, and the collector electrode 153 is formed by lifting off the metal on the photo resist mask. Here, it is not necessary to remove the first collector layer 403 made of InGaAs because collector contact resistance can be lowered by forming the collector electrode 153 on InGaAs with a small bandgap while leaving the first collector layer 403 below the collector electrode 153. Since a manufacturing method to be described hereafter is a general HBT manufacturing method, detailed description shall be omitted. An HBT is formed with a process for sequentially forming the emitter electrode 151 and the base electrode 152, and a process for forming an insulating film.

As described above, according to the HBT of the second embodiment, an HBT with high breakdown tolerance can be manufactured at a high reproducibility and a high yield for the same reasons as the HBT of the first embodiment.

In addition, according to the HBT of the second embodiment, since InGaAs with a small bandgap against the first collector layer 403 is used, it is possible to manufacture a HBT with lower resistance than the HBT of the first embodiment.

Although only some exemplary embodiments of the HBTs according to this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, although in the HBTs according to the embodiments above, single-layer InGaP and InGaAs are presented as a semiconductor forming the first collector layer, the first collector layer may be formed with a laminated body of InGaP and GaAs. The InGaP has a disordered structure, is either doped or non-doped, and contacts the sub-collector layer 102. The GaAs has a higher impurity concentration than the impurity concentration of the InGaP, and contacts the second collector layer 104.

In addition, although in the HBTs according to the embodiments above, InGaP and InGaAs are presented as semiconductors for forming the first collector layer. However, it is needless to say that similar effect can be achieved with AlGaAs. For example, the first collector layer may be formed with AlGaAs doped with impurity at an impurity concentration higher than the impurity concentration of the sub-collector layer. In the case where AlGaAs is used as the first collector layer, an etching solution made of citric acid or hydrogen peroxide is used for wet etching, and chloride etching gas is used for dry etching. Thus, the first collector layer functions as an etching stopper layer, and accuracy of etching process can be significantly in a similar manner when InGaP and InGaAs is used.

In addition, in the HBTs according to the embodiments above, a single-layer semiconductor with a low impurity concentration is presented as a semiconductor for forming the third collector layer 105. However, the semiconductor may be a multi-layer semiconductor with two or more layers, in which the impurity concentration of the semiconductor gradually increases from the boundary surface of the base layer to the boundary surface of the second collector layer 104. Alternatively, the impurity concentration of the semiconductor may gradually changes from the boundary surface of the base layer to the second collector layer 104.

In addition, although in the HBTs according to the embodiments above, InGaP is presented as a semiconductor for forming the emitter layer 107, it is needless to say that similar effect can be achieved with AlGaAs.

In addition, in the embodiments above, although part of the first collector layer is removed by wet etching, the part of the first collector layer may be removed by dry etching. When the first collector layer is made of InGaAs, chloride etching gas is used.

INDUSTRIAL APPLICABILITY

The present invention is used for a heterojunction bipolar transistor, and particularly to a power amplifier and the like used for a terminal transmission unit in the GSM system.

What is claimed is:

1. A heterojunction bipolar transistor comprising:
   a sub-collector layer;
   a collector layer formed on said sub-collector layer;
   a base layer formed on said collector layer; and
   an emitter layer, which is formed on said base layer and is made of a semiconductor that has a larger bandgap than a semiconductor of said base layer,
   wherein said collector layer includes:
   a first collector layer formed on said sub-collector layer;
   a second collector layer formed on said first collector layer; and
   a third collector layer formed between said second collector layer and said base layer,
   wherein said first collector layer is made of InGaP having a disordered structure and an impurity concentration equal to or higher than an impurity concentration of said sub-collector layer;
   a thickness of said first collector layer ranges from 5 nm to 30 nm inclusive;
   said second collector layer and said third collector layer are made of GaAs;
   a thickness of said second collector layer is 400 nm or more;
   a thickness of said third collector layer is 600 nm or less; and
   an impurity concentration of said second collector layer is lower than the impurity concentration of said sub-collector layer and higher than an impurity concentration of said third collector layer.

2. The heterojunction bipolar transistor according to claim 1,
   wherein the first collector layer is made up of a non-doped or doped InGaP layer placed in contact with said sub-collector layer, and a semiconductor layer, placed in contact with said second collector layer, with an impurity concentration higher than the impurity concentration of the InGaP layer.

3. The heterojunction bipolar transistor according to claim 2,
   wherein the InGaP layer has a disordered structure.

4. The heterojunction bipolar transistor according to claim 1,
   wherein said third collector layer is made up of two or more layers of different impurity concentrations.

5. The heterojunction bipolar transistor according to claim 1,
   wherein the impurity concentration of said third collector layer gradually increases from a boundary surface of said third collector layer and said base layer toward a boundary surface of said third collector layer and said second collector layer.

6. The heterojunction bipolar transistor according to claim 1,
wherein the impurity concentration of said second collector layer ranges from $3\times10^{16}$ cm$^{-3}$ to $2\times10^{17}$ cm$^{-3}$, and the impurity concentration of said third collector layer is lower than $3\times10^{16}$ cm$^{-3}$.

7. A method for manufacturing the heterojunction bipolar transistor according to claim 1, said method comprising:
stacking the sub-collector layer, the first collector layer, the second collector layer, the third collector layer, the base layer, and the emitter layer successively; and
etching a part of the emitter layer, base layer, third collector layer, and second collector layer so that the first collector layer is exposed,
wherein, in said stacking, the following layers are stacked: the first collector layer made of a semiconductor different from semiconductors of the third collector layer and the second collector layer; the second collector layer with an impurity concentration lower than the impurity concentration of the sub-collector layer, the impurity concentration being higher than the impurity concentration of the third collector layer; and the emitter layer made of a semiconductor with a bandgap larger than a bandgap of a semiconductor forming the base layer.

8. The method for manufacturing the heterojunction bipolar transistor according to claim 7, further comprising
etching the exposed part of the first collector layer using etching solution different from etching solutions used for etching the second collector layer and the third collector layer.

9. The method for manufacturing the heterojunction bipolar transistor according to claim 8,
wherein, in said stacking, the first collector layer made of InGaP, the second collector layer made of GaAs, and the third collector layer made of GaAs are stacked.

10. The method for manufacturing the heterojunction bipolar transistor according to claim 7,
wherein in said stacking, the first collector layer made of InGaP, the second collector layer made of GaAs, and the third collector layer made of GaAs are stacked.

* * * * *